United States Patent
Hsieh et al.

(10) Patent No.: US 9,479,184 B2
(45) Date of Patent: Oct. 25, 2016

(54) FREQUENCY CALIBRATION APPARATUS OF PHASE LOCKED LOOP AND METHOD THEREOF

(75) Inventors: Ming-Yu Hsieh, Hsinchu Hsien (TW); Shih-Chieh Yen, Hsinchu Hsien (TW); Yao-Chi Wang, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 11 days.

(21) Appl. No.: 12/858,315

(22) Filed: Aug. 17, 2010

(65) Prior Publication Data
US 2011/0057696 A1    Mar. 10, 2011

(30) Foreign Application Priority Data
Sep. 4, 2009  (TW) .............................. 98129821 A

(51) Int. Cl.
H03L 7/087    (2006.01)
H03L 7/099    (2006.01)

(52) U.S. Cl.
CPC ............... *H03L 7/099* (2013.01); *H03L 7/087* (2013.01); *H03L 2207/06* (2013.01)

(58) Field of Classification Search
CPC .... H03L 7/099; H03L 7/087; H03L 2207/06
USPC .......................................................... 702/75
See application file for complete search history.

(56) References Cited

U.S. PATENT DOCUMENTS

| | | | |
|---|---|---|---|
| 4,672,556 A * | 6/1987 | Shepler ............................ 702/78 |
| 6,150,891 A * | 11/2000 | Welland et al. ................ 331/25 |
| 6,311,050 B1 * | 10/2001 | Welland et al. ............... 455/260 |
| 6,539,320 B1 * | 3/2003 | Szajnowski et al. ........... 702/79 |
| 6,741,846 B1 * | 5/2004 | Welland et al. ............... 455/260 |
| 7,023,282 B1 * | 4/2006 | Humpreys et al. ........... 331/1 A |
| 7,064,591 B1 * | 6/2006 | Humphreys et al. ......... 327/156 |
| 7,486,147 B2 * | 2/2009 | Khorram ......................... 331/16 |
| 7,969,248 B1 * | 6/2011 | Whitten et al. ................. 331/16 |
| 2002/0008585 A1 * | 1/2002 | Welland ............................. 331/2 |
| 2003/0171105 A1 * | 9/2003 | Dunworth et al. ........... 455/258 |
| 2003/0197564 A1 * | 10/2003 | Humphreys et al. ........... 331/11 |
| 2004/0000956 A1 * | 1/2004 | Jaehne et al. ................... 331/16 |
| 2004/0075506 A1 * | 4/2004 | Welland et al. ................ 331/74 |
| 2005/0083137 A1 * | 4/2005 | Lee et al. ......................... 331/16 |
| 2005/0137816 A1 * | 6/2005 | Chuang et al. ............... 702/106 |
| 2006/0214737 A1 * | 9/2006 | Brown et al. ................... 331/16 |
| 2006/0269014 A1 * | 11/2006 | Li ......................... H03B 27/00 375/327 |
| 2008/0015800 A1 * | 1/2008 | Hoelzle .......................... 702/75 |
| 2008/0054960 A1 * | 3/2008 | Becke et al. .................. 327/157 |
| 2008/0100385 A1 * | 5/2008 | Lin ................................. 331/16 |
| 2008/0195341 A1 * | 8/2008 | Jenkins et al. .................. 702/79 |
| 2008/0297221 A1 * | 12/2008 | Denda et al. .................. 327/276 |
| 2009/0237132 A1 * | 9/2009 | Wang et al. .................. 327/157 |

(Continued)

*Primary Examiner* — Regis Betsch
(74) *Attorney, Agent, or Firm* — Han IP Corporation; Andy M. Han

(57) ABSTRACT

A frequency calibration apparatus, applied to a phase locked loop (PLL), includes a frequency detecting module and a search module. The frequency detecting module includes a first counter, a second counter and a comparing unit. During a monitoring period, the first counter and the second counter respectively generates a first count and a second count. The comparing unit compares the first count with the second count to generate a comparison result indicating at least three situations. The search module selects a frequency curve in response to the comparison result, and calibrates configuration of a voltage controlled oscillator (VCO) according to the frequency curve.

20 Claims, 7 Drawing Sheets

(56) References Cited

U.S. PATENT DOCUMENTS

| | | | |
|---|---|---|---|
| 2009/0290717 A1* | 11/2009 | Kushida et al. | 381/17 |
| 2010/0057390 A1* | 3/2010 | Kebabian | 702/79 |
| 2010/0073048 A1* | 3/2010 | Ke et al. | 327/157 |
| 2010/0171535 A1* | 7/2010 | Shanan | 327/157 |
| 2010/0171652 A1* | 7/2010 | Gutt et al. | 342/352 |
| 2010/0213984 A1* | 8/2010 | Shin et al. | 327/105 |
| 2011/0082657 A1* | 4/2011 | Ito | 702/79 |

* cited by examiner

FREQUENCY CALIBRATION APPARATUS OF PHASE LOCKED LOOP AND METHOD THEREOF

CROSS REFERENCE TO RELATED PATENT APPLICATIONS

This patent application claims priority from Taiwan Patent Application No. 098129821, filed in the Taiwan Patent Office on Sep. 4, 2009, entitled "Frequency Calibration Apparatus of Phase Locked Loop and Method Thereof", and incorporates the Taiwan patent application in its entirety by reference.

TECHNICAL FIELD

The present disclosure relates to a phase locked loop (PLL), and more particularly, to a frequency calibration apparatus of a PLL and an operating method thereof.

BACKGROUND OF THE PRESENT DISCLOSURE

Generally speaking, a PLL mainly comprises a phase detector, a charge pump, a loop filter and a voltage controlled oscillator (VCO). In practice, the PLL is widely applied to electronic and communication products, e.g., memories, microprocessors, hard disk driving apparatuses, radio frequency (RF) transceivers, and fiber optic transceivers.

FIG. 1 shows a block diagram of a conventional frequency calibration apparatus applied to a PLL. A frequency calibration apparatus 1 comprises a frequency detecting module 10 and a state machine 12. The frequency detecting module 10 comprises a multiplier 100, a first counter 102, a second counter 104 and a comparing unit 106. The multiplier 100 is coupled to the first counter 102; the first counter 102 and the second counter 104 are coupled to the comparing unit 106; and the comparing unit 106 is coupled to the state machine 12. A reference clock CKR entering the frequency calibration apparatus 1 is generated from dividing a reference frequency by a reference frequency divider. A feedback clock CKV entering the frequency calibration apparatus 1 is generated from dividing an output frequency of a VCO of the PLL by a main frequency divider.

When the low-speed reference clock CKR enters the frequency calibration apparatus 1, the multiplier 100 multiplies the low-speed reference clock CKR by a constant to generate a high-speed clock MCKR. After that, the first counter 102 generates a first count according to the high-speed clock MCKR. When the high-speed feedback clock CKV enters the frequency calibration apparatus 1, the second counter 104 directly generates a second count according to the feedback clock CKV. It is to be noted that the first counter 102 and the second counter 104 are operated with a high-speed as well.

The comparing unit 106 receives the first count and the second count from the first counter 102 and the second counter 104, respectively, and compares the first count with the second count to generate a comparison result indicating that the second count is greater or smaller than the first count. After that, the state machine 12 selects an optimal frequency curve and calibrates the output frequency of the VCO of the PLL according to the optimal frequency curve. It is to be noted that, the frequency calibration apparatus 1 iterates the foregoing frequency calibration procedure to the PLL in a frequency locked mode until a ratio of the calibrated output frequency and the reference frequency approximates a predetermined ratio. Further, monitoring periods applied every time the calibration procedure is iterated are the same length.

In conclusion, the conventional calibration apparatus 1 still has numerous disadvantages to be overcome. For example, since the conventional frequency calibration apparatus 1 adopts a low-speed reference clock CKR and a same monitoring period in every calibration procedure, an overall calibration time for calibrating the output frequency of the PLL by the conventional frequency calibration apparatus 1 is long. In addition, the frequency calibration apparatus 1 first applies the multiplier 100 to process the low-speed reference clock CKR, and then applies the first counter 102 to generate the first count according to the high-speed clock MCKR, such that not only the first counter 102 and the second counter 104 need to be operated with the high-speed, but also cost of the frequency calibration apparatus 1 is additionally increased due to the multiplier 100.

Therefore, a main object of the present disclosure is to provide a frequency calibration apparatus applied to a PLL and an operating method thereof to solve the foregoing issues.

SUMMARY OF THE PRESENT DISCLOSURE

According to an embodiment of the present disclosure, a frequency calibration apparatus, applied to a PLL, comprises a reference frequency divider, a main frequency divider, and a VCO. The frequency calibration apparatus comprises a frequency detecting module and a search module. The frequency detecting module comprises a first counter, a second counter and a comparing unit.

During a monitoring period, the first counter receives a reference clock from the reference frequency divider, and generates a first count according to the reference clock. During the monitoring period, the second counter receives a feedback clock from the main frequency divider, and generates a second count according to the feedback clock. The comparing unit compares the second count with the first count to generate a comparison result that indicates at least three statuses. The search module selects a frequency curve in response to the comparison result, and calibrates configuration of the VCO according to the frequency curve.

According to another embodiment of the present disclosure, a frequency calibration method is applied to a PLL is provided. The PLL comprises a frequency calibration apparatus, a reference frequency divider, a main frequency divider, and a VCO. During a monitoring period, the method comprises receiving a reference clock from the reference frequency divider and generating a first count according to the reference clock; and receiving a feedback clock from the main frequency divider and generating a second count according to the feedback clock. The method further comprises comparing the second count with the first count to generate a comparison result that indicates at least three statuses; and selecting a frequency curve in response to the comparison result and calibrating configuration of the VCO according to the frequency curve.

According to yet another embodiment of the present disclosure, a PLL comprises a reference frequency divider, a main frequency divider, a frequency calibration apparatus, and a VCO. The reference frequency divider generates a reference clock. The main frequency divider generates a feedback clock. The frequency calibration apparatus comprises a frequency detecting module and a search module. The frequency detecting module comprises a first counter, a second counter, a shifting unit, and a comparing unit. The first counter receives the reference clock from the reference frequency divider, and generates a first count according to the reference clock. The second counter receives the feedback clock from the main frequency divider, and generates a second count according to the feedback clock. A frequency of the feedback clock is greater than that of the reference clock. The shifting unit shifts the first count to generate a shifted count. The comparing unit compares the second count with the shifted count to generate a comparison result. The search module selects a frequency curve in response to the comparison result. The VCO adjusts its configuration according to the frequency curve.

In conclusion, since a frequency calibration apparatus applied to a PLL according to the present disclosure implements a low-speed reference clock and adopts monitoring periods having different lengths every time a calibration procedure is iterated, an overall calibration time for calibrating an output frequency of the PLL by the frequency calibration apparatus is significantly reduced. In addition, the frequency calibration apparatus according to the present disclosure first applies a counter to generate a count according to the low-speed reference clock, and then applies a shifting unit to shift the count, such that the counter only needs to be operated with a low-speed. Further, since cost of the shifting unit is much lower than that of a multiplier, production cost of the frequency calibration apparatus applied to the PLL is accordingly reduced to increase market competitiveness.

The advantages and spirit related to the present disclosure can be further understood via the following detailed description and drawings.

DETAILED DESCRIPTION OF THE PREFERRED EMBODIMENT

Figure 1:
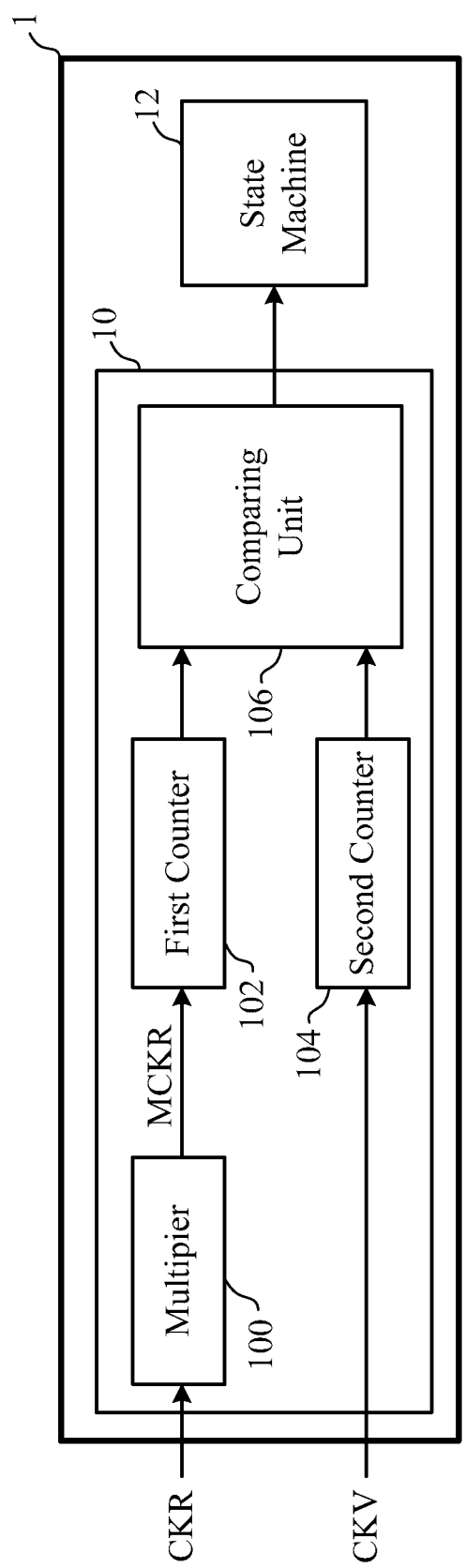
FIG. 1 is a block diagram of a conventional frequency calibration apparatus applied to a PLL.
Figure 2:
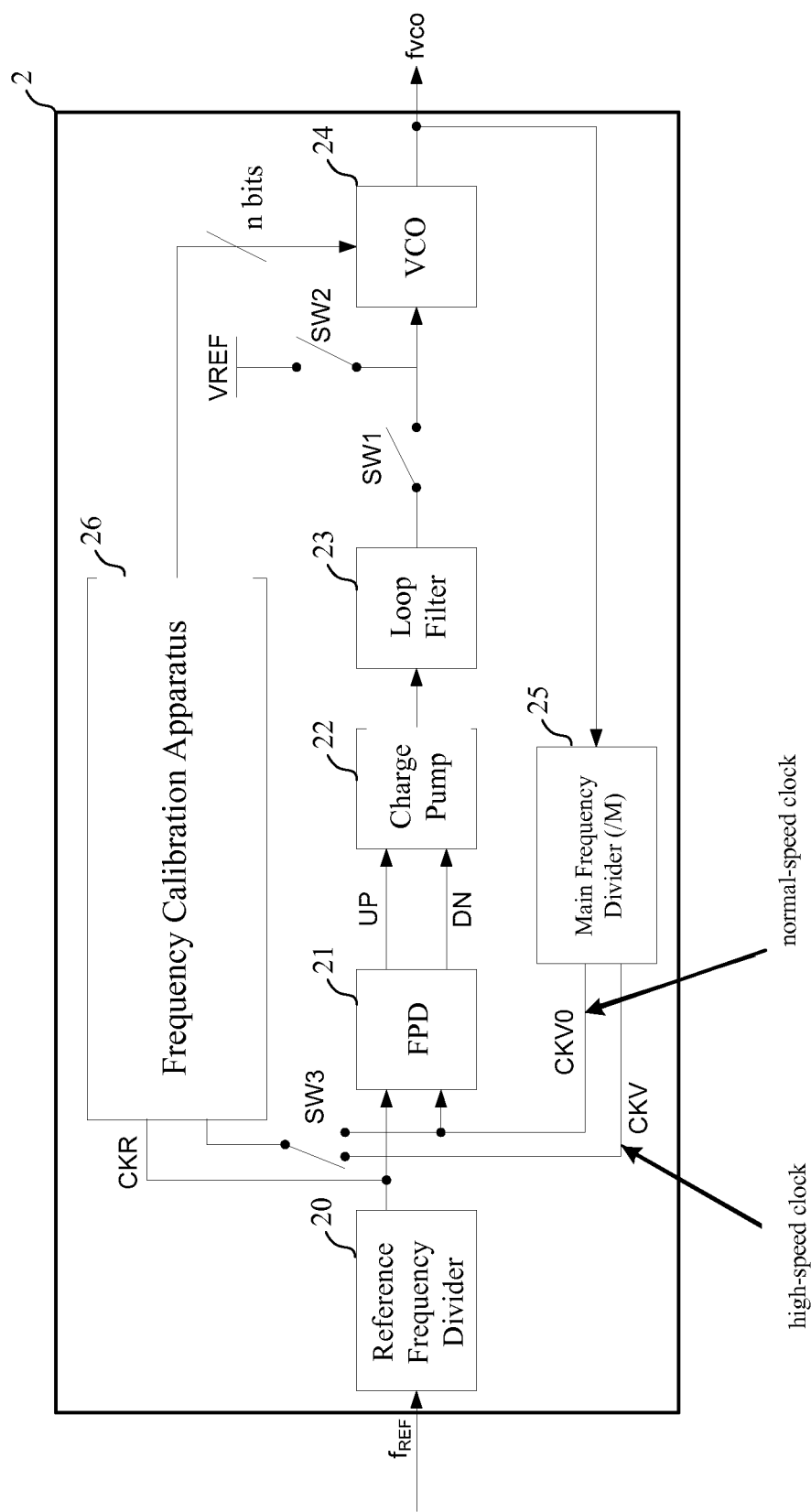
FIG. 2 is a block diagram of a PLL in accordance with a first embodiment of the present disclosure.

According to a first embodiment of the present disclosure, a PLL is provided. FIG. 2 shows a block diagram of the PLL. A PLL 2 mainly comprises a reference frequency divider 20, a PFD (Phase-Frequency Detector) 21, a charge pump 22, a loop filter 23, a VCO 24, a main frequency divider 25, and a frequency calibration apparatus 26. The reference frequency divider 20 is coupled to the PFD 21; the PFD 21 is respectively coupled to the charge pump 22 and the main frequency divider 25; the loop filter 23 is respectively coupled to the charge pump 22 and the VCO 24; the main frequency divider 25 is coupled to the VCO 24; the frequency calibration apparatus 26 is respectively coupled to the reference frequency divider 20, the VCO 24 and the main frequency divider 25; and a reference voltage $V_{REF}$ is coupled between the loop filter 23 and the VCO 24.

In practice, the reference frequency divider 20 of the PLL 2 receives a reference frequency $f_{REF}$, and the VCO 24 generates an output frequency $f_{VCO}$. In addition, the PLL 2 further comprises a first switch SW1, a second switch SW2 and a third switch SW3. The first SW1 is coupled between the loop filter 23 and the VCO 24; the second switch SW2 is coupled between the reference voltage $V_{REF}$ and the VCO 24; and the third switch SW3 is for switching between a first feedback clock CKV and a second feedback clock CKV0 to allow either of them to reach the frequency calibration apparatus 26. In this embodiment, the first feedback clock CKV is a high-speed clock, and the second feedback clock CKV0 is a normal-speed clock, which are determined from adjusting a divisor M by the main frequency divider 25.

Figure 3:
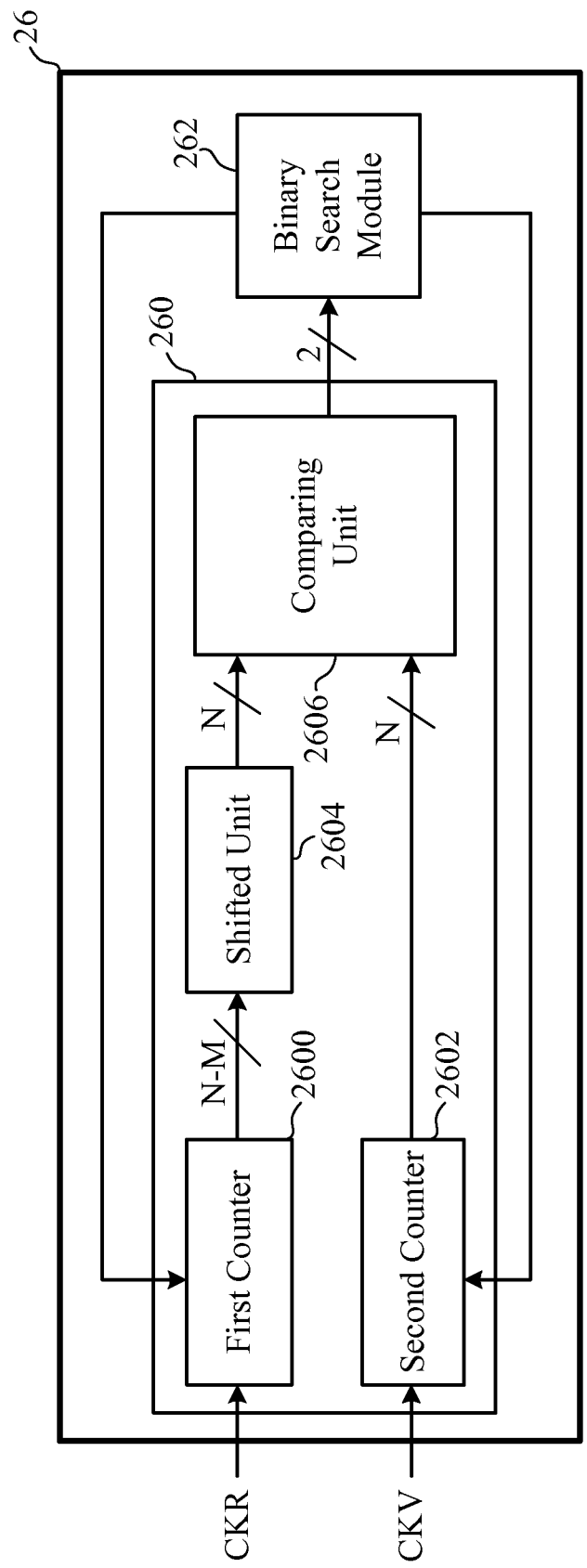
FIG. 3 is a block diagram of a frequency calibration apparatus of a PLL.

The frequency calibration apparatus 26 of the PLL 2 is to be described below in detail. FIG. 3 shows a block diagram of the frequency calibration apparatus of the PLL 2. The frequency calibration apparatus 26 comprises a frequency detecting module 260 and a binary search module 262. The frequency detecting module 260 comprises a first counter 2600, a second counter 2602, a shifting unit 2604, and a comparing unit 2606. The first counter 2600 is coupled to the reference frequency divider 20 and the shifting unit 2604; the second counter 2602 is coupled to the main frequency divider 25; the comparing unit 2606 is coupled to the shifting unit 2604 and the second counter 2602; and the binary search module 262 is coupled to the first counter 2600, the second counter 2602 and the comparing unit 2606.

In this embodiment, the frequency calibration apparatus 26 of the PLL 2 is operated in a frequency locked mode. In the frequency locked mode, the first switch SW1 is open, the second switch SW2 is closed, and the third switch SW3 is coupled to the first feedback clock CKV. The frequency calibration apparatus 26 calibrates the output frequency $f_{VCO}$ outputted by the VCO 24, so that a ratio of the output frequency $f_{VCO}$ and the reference frequency $f_{REF}$ approximates a predetermined ratio. Operations of the frequency calibration apparatus 26 in the frequency locked mode are to be discussed.

Referring to FIG. 2 and FIG. 3, the frequency detecting module 260 compares the reference clock CKR with the first feedback clock CKV (or the second feedback clock CKV0) to generate a comparison result that is regarded as a basis for the binary search module 262 to adjust the VCO 24. The reference clock CKR is generated from the reference frequency $f_{REF}$ by the reference frequency divider 20 according to a predetermined multiple (e.g. ¼). The first counter 2600 generates a first count according to the reference clock CKR. The first feedback clock CKV and the second feedback clock CKV0 are respectively generated from frequency dividing the output frequency $f_{VCO}$ of the VCO 24 by the predetermined divisor M by the main frequency divider 25. The second counter 2602 generates a second count according to the first feedback clock CKV (or the second feedback CKV0). More specifically, the first feedback clock CKV, a relative high-speed clock, is provided to the frequency calibration apparatus 26 in the frequency locked mode to calibrate the output frequency $f_{VCO}$, so as to reduce an overall calibration time. The second feedback clock CKV0, a normal-speed clock, is provided to the PFD 21 in a phase locked mode, or is provided to the frequency calibration apparatus 26 in the frequency locked mode to calibrate the output frequency $f_{VCO}$, but without rendering the advantage of reducing the overall calibration time.

It is to be noted that, in this embodiment, the first feedback clock CKV rate is designed as a power of 2 times the reference clock CKR rate, e.g., 2, 4, 8 times, and so forth. Therefore, the shifting unit 2604 shifts the first count generated by the first counter 2600 to generate a shifted count (i.e., the first count is multiplied by the power of 2). The shifted count is transmitted to the comparing unit 16 to be compared with the second count, so that an accurate comparison result is obtained. For example, supposing that the first feedback clock CKV rate is designed as M-th power of 2 times the reference clock CKR rate, before the comparing unit 16 (e.g., an N-bit comparing unit) compares the first count with the second count, the first count is shifted by M bits by the shifting unit 2604, i.e., M-bit zeros are complemented (i.e., the first count is multiplied by the M-th power of 2), so that the second count also has N bits to accurately determine an output frequency range of the VCO 24.

As mentioned above, the reference clock CKR is a low-speed clock and the first feedback clock CKV is a high-speed clock. Therefore, the first counter 2600 of the frequency calibration apparatus 26 only needs to operate with a low-speed, instead of with the high-speed as the second counter 2602 does. In addition, the shifting unit 2604 may be a common shifting unit to replace the multiplier in the prior art. The foregoing design is capable of significantly reducing circuit cost of the present disclosure.

The comparing unit 2606 compares the second count with the shifted count both having N bits to generate a comparison result. It is to be noted that, the comparing unit 2606 compares a value of the second count with that of the shifted count, such that the comparison result indicates three possible situations—(1) the second count is larger than the shifted count, (2) the second count is equal to the shifted count, and (3) the second count is smaller than the shifted count. Therefore, in order to represent the three possible situations, the comparing unit 2606 outputs the comparison result in the form of two control bits to the binary search module 262.

The second search module 262 is for selecting an optimal VCO frequency curve from n VCO frequency curves of the VCO 24. The binary search module 262 determines one bit of the optimal VCO frequency curve every time according to the comparison result of the comparing unit 2606, and iterates several times to determine the optimal VCO frequency curve. For example, supposing that the VCO frequency curve has 16 curves (i.e., 4-th power of 2 curves) and a predetermined VCO frequency curve is 1000, when the comparing unit 2606 generates a first comparison result, the binary search module 262 determines a most significant bit (MSB) and a second MSB according to the first comparison result, while other bits are set to "0". After iterating the foregoing calibration procedure three times, the optimal frequency curve is selected and is provided to the VCO 24 to calibrate the output frequency $f_{VCO}$ according to the optimal frequency curve. It is to be noted that, the frequency calibration apparatus 26 adopts monitoring periods having different lengths when iterating the calibration procedure. More specifically, in an initial stage of the calibration procedure, when the binary search module 262 determines the MSB of the VCO frequency curve, the VCO frequency curves determined at this point are far from the optimal VCO frequency curve, and hence the comparing unit 2606 can nevertheless generate a difference even when only a short period is adopted (i.e., the first counter 2600 and the second counter 2602 only needs to perform fewer of calculations). However, when the binary search module 262 determines a least significant bit (LSB) of the VCO frequency curve, the VCO frequency curves determined at this point are approximate to the optimal VCO frequency curve, and hence the comparing unit 2606 can only generate a difference when a long period is adopted (i.e., the first counter 2600 and the second counter 2602 have to perform more calculations). In this embodiment, when the frequency calibration apparatus 26 determines the MSB, a shorter monitoring period is adopted; when the frequency calibration apparatus 26 determines the LSB, a longer monitoring period is adopted. Accordingly, the bits of the optimal VCO frequency curve are accurately determined, and the overall calibration time of the frequency calibration apparatus 26 is significantly reduced, so as to effectively overcome the disadvantage that the overall calibration time is too long due to the monitoring periods having the same length as in the prior art.

In addition, when the optimal VCO frequency curve is selected by the binary search module 262, it means that the current calibration procedure is completed by the frequency calibration apparatus 26. At this point, the binary search module 262 transmits a control signal to halt the first counter 2600 and the second counter 2602, and the PLL 2 enters the phase locked mode. That is to say, the first switch SW1 becomes closed, and the second switch SW2 becomes open. FIG. 2 shows operations of the PLL 2 in the phase locked mode. When the PLL2 is in the phase locked mode, the PFD 21 respectively receives the reference clock CKR and the second feedback clock CKV0 from the reference frequency divider 20 and the main frequency divider 25, and detects a phase difference between the reference clock CKR and the feedback clock CKV0 to selectively generate an up index UP and a down index DN. Next, the charge pump 22 adjusts a control current according to the up index UP or the down index DN, and the loop filter 23 adjusts its control voltage outputted to the VCO 24 according to the control current, so that the ratio of the output frequency $f_{VCO}$ of the VCO 24 and the reference frequency $f_{REF}$ approximates the predetermined ratio.

Figures 4A, 4B:
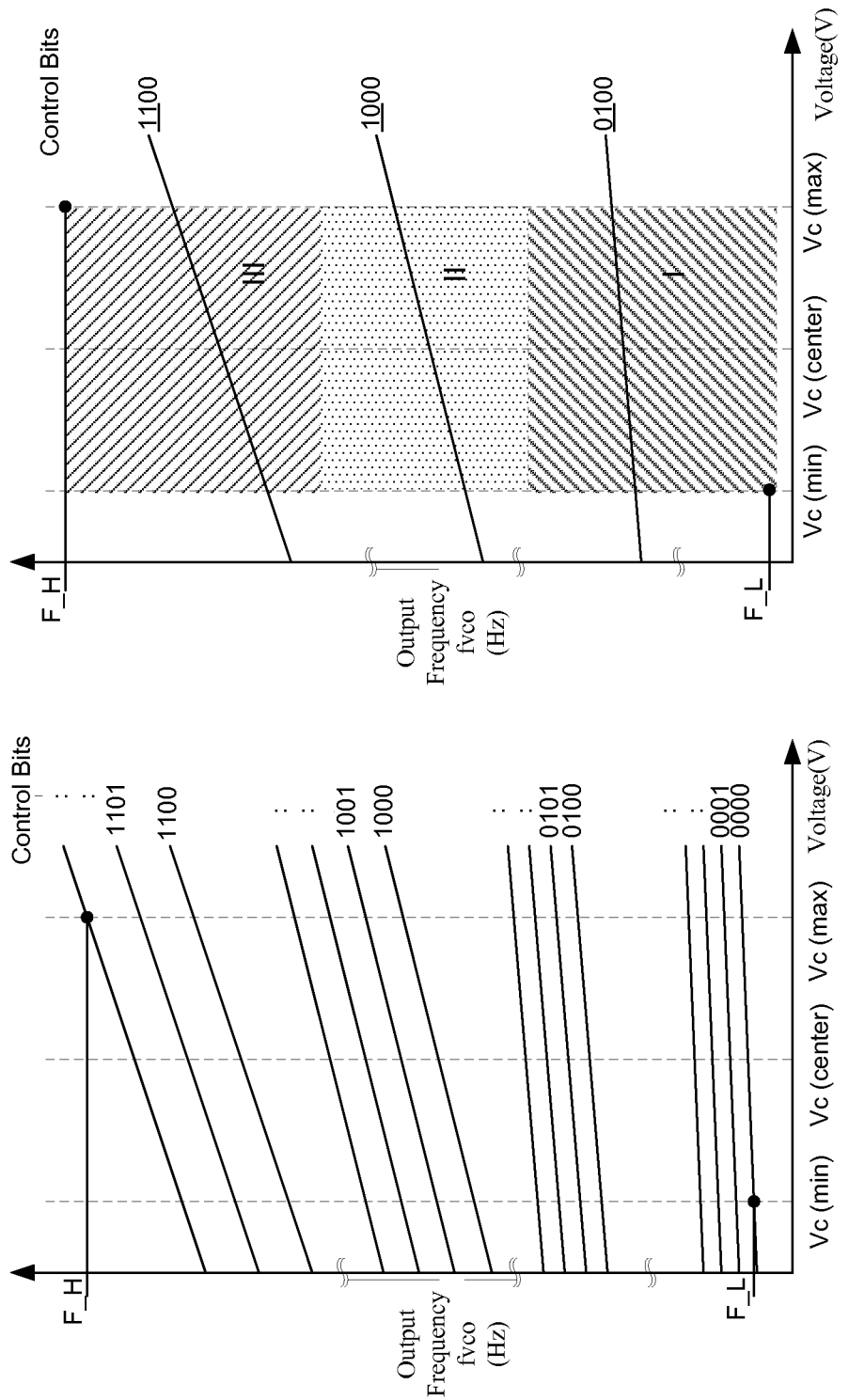
FIG. 4A to FIG. 4D are curves of an output frequency $f_{VCO}$ of a VCO and a control voltage Vc.

FIG. 4A shows a relation curve of the output frequency $f_{VCO}$ of the VCO 24 and a control voltage Vc. Suppose that a predetermined control voltage Vc(center) is in the middle of a range between a minimum control voltage Vc(min) and a maximum control voltage Vc(max), and frequency curves respectively correspond to different shifted counts. In this embodiment, each of the shifted counts has four control bits, such that a minimum shifted count is "0000" and a maximum shifted count is "1111", which respectively correspond to a lower frequency limit F_L and an upper frequency limit F_H.

Figure 4D:
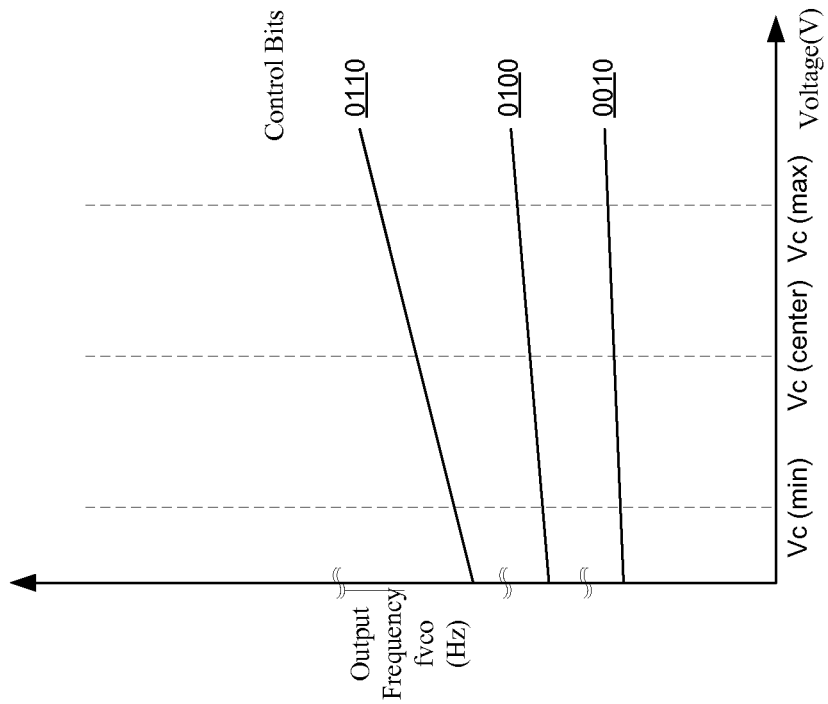
Figure 4C:
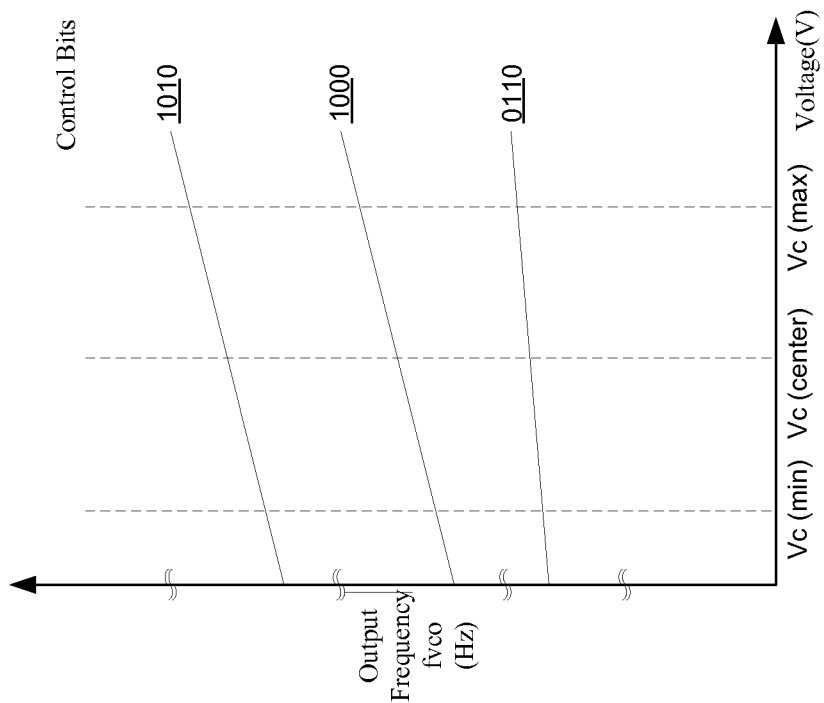

For convenience, in FIG. 4B, areas I, area II and area III, formed by the minimum control voltage Vc(min), the maximum control voltage Vc(max), the upper frequency limit F_H and the lower frequency limit F_L, are represented by frequency curves corresponding to shifted counts "0100", "1000" and "1100". Referring to FIG. 4C, supposing that the comparison result generated by the comparing unit 2606 indicates that the second count is equal to the shifted count, the binary search module 262 selects the frequency curve "1000", and two frequency curves "0110" and "1010" above and below the frequency curve "1000", as three candidate frequency curves. Referring to FIG. 4D, supposing that the comparison result generated by the comparing unit 2606 indicates that the second count is smaller than the shifted count, the binary search module 262 selects the frequency curve "0100", and two frequency curves the "0110" and "0010" above and below the frequency curve "0100", as three candidate frequency curves.

Figure 5:
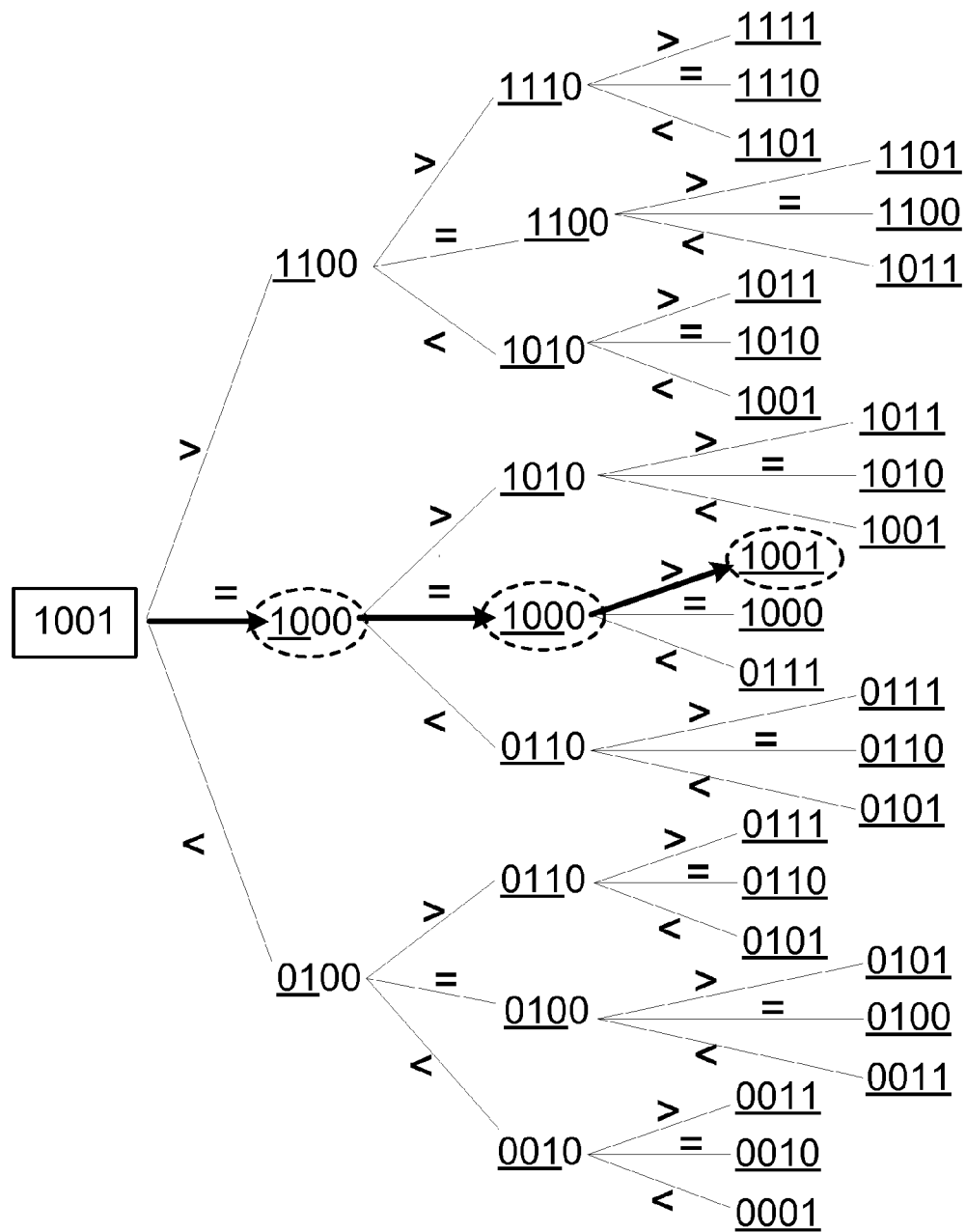
FIG. 5 is a schematic diagram of searching for by a frequency calibration apparatus an optimal frequency curve from performing a calibration procedure several times.

FIG. 5 shows a schematic diagram of how to determine an optimal frequency curve by the frequency calibration apparatus 26 via several of calibration procedures. Supposing that there are eight frequency curves each having four bits, an initial frequency curve is defined as "1000", the optimal frequency curve is "1001", and the control bits comprise at least two bits including three statuses of being "greater than", "equal to" and "smaller than". Under such circumstances, the binary search module 262 performs the calibration procedure three times to determine the optimal frequency curve. More specifically, in this embodiment, the first calibration procedure and the second calibration procedure adopt a shorter monitoring period, and the third calibration procedure adopt a longer monitoring period.

During the first calibration procedure, the binary search module 262 first determines a first bit and a second bit, i.e., one frequency curve is selected from the three candidate frequency curves "1000", "1100" and "0100". For example, when the control signal is "greater than", the frequency curve "1100" is selected; when the control signal is "smaller than", the frequency curve "0100" is selected; when the control signal is "equal to", the frequency curve "1000" is selected. Since the first monitoring period is set to be a short monitoring period and the initial frequency curve "1000" approximates to the optimal frequency curve "1001", there is no difference between the second count and the shifted count when the first monitoring period ends. Thus, the comparing unit 2606 outputs the control signal indicating the "equal to" situation, and accordingly the binary search module 262 selects the frequency curve "1000".

During the second calibration procedure, the binary search module 262 determines the second bit and a third bit, i.e., one frequency curve is selected from the three frequency curves "1000", "1010" and "0110". Likewise, since the second monitoring period is also set to be a short monitoring period and the current frequency curve "1000" approximates the optimal frequency curve "1001", there is no difference between the second count and the shifted count when the second monitoring period ends. Thus, the comparing unit 2606 outputs the control signal indicating the "equal to" situation, and accordingly the binary search module 262 selects the frequency curve "1000".

During the third calibration procedure, the binary search module 262 determines the third bit and a fourth bit, i.e., one frequency curve is selected from the three frequency curves "1000", "1001" and "0111". Since the third calibration procedure adopts is set to be a long monitoring period, there is a difference between the second count and shifted count even when the current frequency curve "1000" approximates the optimal frequency curve "1001". Thus, the comparing unit 2606 outputs the control signal indicating the "greater than" situation, and accordingly the binary search module 262 selects the frequency curve "1001" as a result of the optimal frequency curve "1000" obtained in the first calibration procedure due to the first comparison result indicating that the second count is equal to the shifted count. It is to be noted that, for that the frequency calibration apparatus 26 adopts monitoring periods of different time lengths each time the calibration procedure iterates, effect of reducing the calibration time becomes more obvious as the number of frequency curves gets larger.

When a calibrated output frequency $f_{VCO}$ generated by calibrating the output frequency $f_{VCO}$ of the VCO 24 according to the frequency curve "1001" is equal to the reference frequency $f_{REF}$, it means that the frequency calibration apparatus 26 has completed calibrating the PLL 2, which then enters the phase locked mode.

Figure 6:
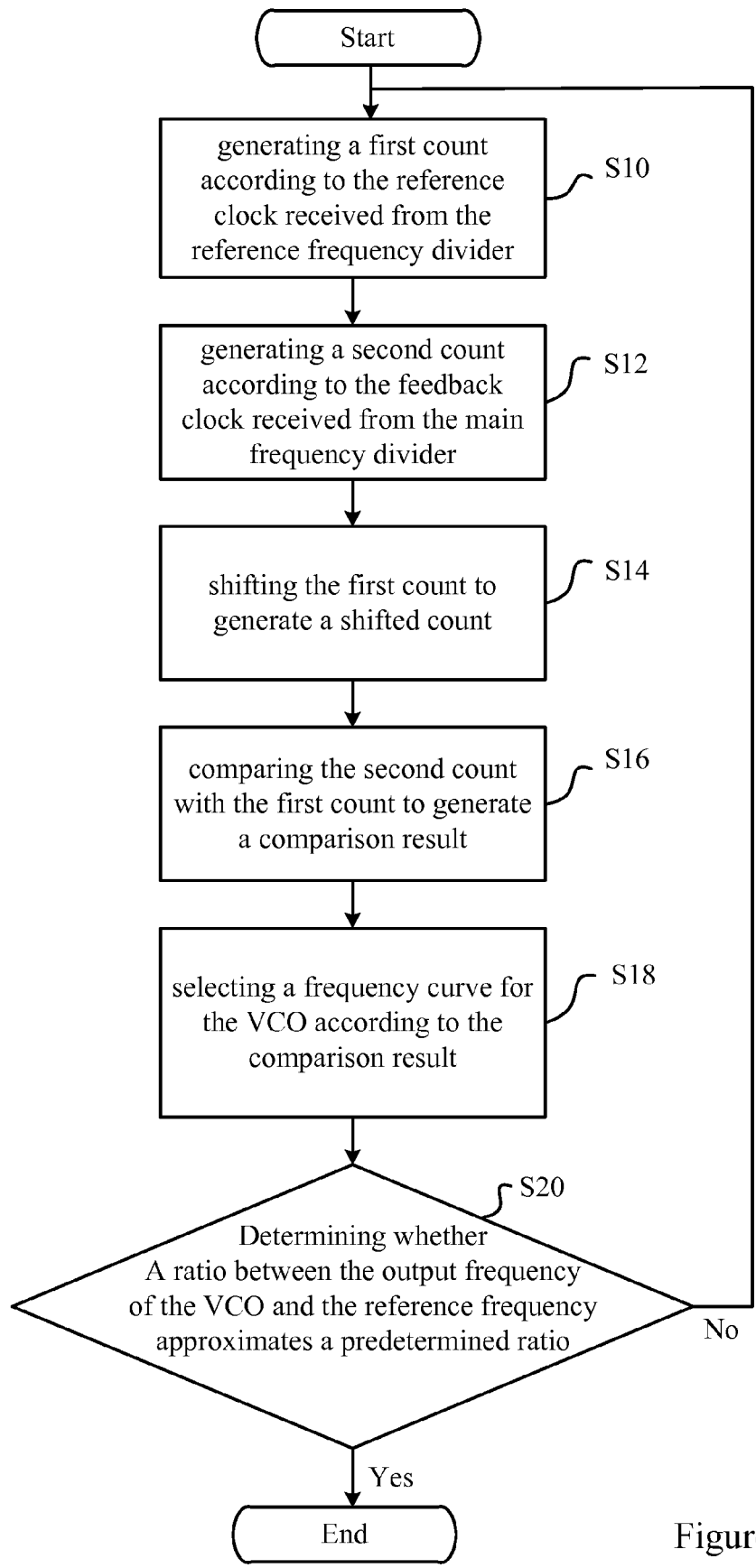
FIG. 6 is a flow chart of a frequency calibration method in accordance with a third embodiment of the present disclosure.

According to a second embodiment of the present disclosure, a method for operating a frequency calibration apparatus is provided. In this embodiment, the frequency calibration apparatus is applied to a PLL and is operated in a phase locked mode. The PLL comprises a reference frequency divider, a main frequency divider and a VCO. FIG. 6 shows a flow chart of the method for operating the frequency calibration apparatus in accordance with the second embodiment of the present disclosure.

The method begins with Step S10 in which a reference clock is received from the reference frequency divider and a first count is generated according to the reference clock. In practice, the reference clock is generated from frequency dividing a reference frequency by the reference frequency divider of the PLL. In Step S12, a first feedback clock is received from the main frequency divider and a second count is generated according to the first feedback clock. For example, the first feedback clock is generated from frequency dividing an output frequency of the VCO by the main frequency divider of the PLL.

It is to be noted that, the first feedback clock rate is higher than the reference clock rate, i.e., compared to the high-speed first feedback clock, a low-speed reference clock is implemented in this embodiment. In addition to generating the first feedback clock, the main frequency divider also generates a second feedback clock to the PLL, with the second feedback clock rate being lower than the first feedback clock rate. That is to say, the main frequency divider generates the faster feedback clock to the frequency calibration apparatus, and generates the slower feedback clock to the PLL.

In Step S14, the first count is shifted to generate a shifted count. In practical applications, suppose that the first count comprises (N−M) control bits, the second count comprises N control bits, and N and M are positive integers, where N is larger than M. In Step S14, the first count shifted by M control bits becomes the shifted count that comprises the same number of N control bits as the second count.

In Step S16, the second count is compared with the shifted count to generate a comparison result. For example, the comparison result indicates three possible situations—(1) the second count is greater than the shifted count, (2) the second count is equal to the shifted count, and (3) the second count is smaller than the shifted count. In Step S18, an optimal reference curve is selected from three candidate VCO frequency curves in response to the comparison result to calibrate an output frequency of the VCO. For example, the three candidate VCO frequency curves respectively correspond to the three possible situations of the comparison result.

After Step S10 to Step S18 are performed, a procedure for calibrating the output frequency of the VCO is completed once. The method proceeds to Step S20 in which it is determined whether a ratio between the output frequency of the VCO and the reference frequency approximates a predetermined ratio. The predetermined ratio is specifically limited. For example, when the predetermined ratio is equal to 1, it means that the output frequency is equal to the reference frequency.

When the determination result of Step S20 is positive, it means that the frequency calibration procedure of the PLL is completed by the frequency calibration apparatus, so that the PLL enters a phase locked mode. When the determination result of Step S20 is negative, it means that the ratio between the output frequency and the reference frequency does not approximate the predetermined ratio, i.e., the frequency calibration procedure of the PLL is not yet completed, such that the frequency calibration apparatus iterates Steps S10 to S18 until the ratio between the calibrated output frequency and the reference frequency approximates the predetermined ratio. It is to be noted that, during each iteration of the frequency calibration procedure carried out by the frequency calibration apparatus, monitoring periods of different time lengths are adopted to reduce an overall calibration time of the frequency calibration apparatus.

Compared to the prior art, since a frequency calibration apparatus applied to a PLL according to the present disclosure implements a low-speed reference clock and monitoring periods of different time lengths during each iteration of a frequency calibration procedure, an overall time for calibrating by the frequency calibration apparatus a frequency of the PLL is significantly reduced. In addition, the frequency calibration apparatus first applies a counter to generate a count according to the low-speed reference clock, and then applies a shifting unit to shift the count, so that the counter only needs to be operated with a low-speed. In addition, for that cost of the shifting unit is much lower than that of a multiplier, production cost of the frequency calibration apparatus applied to the PLL according to the present disclosure is accordingly reduced to improve market competitiveness.

While the disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A frequency calibration apparatus, applied to a phased locked loop (PLL) that comprises a reference frequency divider, a main frequency divider and a voltage control oscillator (VCO), the frequency calibration apparatus comprising:
   a frequency detecting module, coupled to the reference frequency divider and the main frequency divider, that compares a feedback clock with a reference clock to generate three comparison results, the frequency detecting module comprising:
     a first counter that generates a first count according to the reference clock received from the reference frequency divider during a monitoring period;
     a second counter that generates a second count according to the feedback clock received from the frequency divider during the monitoring period;
     a comparing unit, coupled to the first counter and the second counter, that compares the second count with the first count to generate the three comparison results; and
     a search module, coupled to the comparing unit and the VCO, that selects three candidate frequency curves from a plurality of candidate frequency curves and selects a frequency curve from the three candidate frequency curves for the VCO respectively corresponding to the three comparison results.

2. The frequency calibration apparatus as claimed in claim 1, wherein when the feedback clock rate is higher than the reference clock rate, the frequency detecting module further comprises:
   a shifting unit, coupled between the first counter and the second counter, that shifts the first count to generate a shifted count.

3. The frequency calibration apparatus as claimed in claim 2, wherein the first count has (N−M) bits, the second count has N bits, and the shifting unit shifts the first count by M bits so that the shifted count has N bits, wherein N and M are positive integers and N is greater than M.

4. The frequency calibration apparatus as claimed in claim 1, wherein the feedback clock is frequency divided from an output frequency of the VCO by the main frequency divider.

5. The frequency calibration apparatus as claimed in claim 1, wherein the search module further calibrates an output frequency of the VCO according to the frequency curve, and controls the operation of the first counter and the second counter by generating a control signal according to a ratio between an output frequency calibrated by the frequency curve and the reference frequency.

6. The frequency calibration apparatus as claimed in claim 1, wherein the comparison result provides indication that the second count is greater than the first count, the second count is equal to the first count, or the second count is smaller than the first count.

7. The frequency calibration apparatus as claimed in claim 1, wherein the search module calibrates an output frequency of the VCO according to the frequency curve, and the frequency detecting module iterates a frequency calibration procedure of the PLL in a frequency locked mode until a ratio of the calibrated output frequency to the reference frequency approximates a predetermined ratio, and wherein the monitoring period in a first frequency calibration procedure has a respective length in time that is different from a respective length in time in a second frequency calibration procedure.

8. A frequency calibration method, applied to a phase locked loop (PLL) that comprises a frequency calibration apparatus, a reference frequency divider, a main frequency divider and a voltage control oscillator (VCO), the method comprising:
   generating a first count according to a reference clock received from the reference frequency divider during a monitoring period;
   generating a second count according to a feedback clock received from the main frequency divider during the monitoring period;
   comparing the second count with the first count to generate at three comparison results;
   selecting three candidate frequency curves from a plurality of candidate frequency curves; and
   selecting a frequency curve from the three candidate frequency curves for the VCO respectively corresponding to the three comparison results.

9. The method as claimed in claim 8, further comprising shifting the first count to generate a shifted count before comparing the second count with the first count when the feedback clock rate is higher than the reference clock rate.

10. The method as claimed in claim 9, an output frequency of the VCO being calibrated according to the frequency curve, the method further comprising:
    determining whether a ratio of the output frequency calibrated according to the frequency curve to the reference frequency approximates a predetermined ratio;
    if the ratio approximates the predetermined ratio, completing the frequency calibration procedure and entering a phase locked mode; and if the ratio does not approximate the predetermined ratio, iterating the frequency calibration procedure;
wherein the monitoring period of each iteration of the frequency calibration procedure may be implemented by a length in time that differs from that of a prior implementation of the frequency calibration procedure.

11. The method as claimed in claim 9, wherein the first count has (N−M) bits, the second count has N bits, and the first count is shifted by M bits in generating the shifted count such that the shifted count has N bits, wherein N and M are positive integers and N is greater than M.

12. The method as claimed in claim 9, wherein the comparison result is one of the following: the second count is greater than the shifted count, the second count is equal to the shifted count, and the second count is smaller than the shifted count.

13. The method as claimed in claim 8, wherein the feedback clock is frequency divided from an output frequency of the VCO by the main frequency divider.

14. A phase locked loop (PLL), comprising:
a reference frequency divider that receives a reference frequency from a clock and generates a reference clock;
a main frequency divider that generates a first feedback clock;
a frequency calibration apparatus, comprising:
a frequency detecting module, coupled to receive the reference clock from the reference frequency divider and receive the first feedback clock from the main frequency divider, that compares a feedback clock with a reference clock to generate a comparison result, the frequency detecting module comprising:
a first count unit that generates a first count according to the reference clock received from the reference divider;
a second count unit that generates a second count according to the first feedback clock received from the main frequency divider, a frequency of the first feedback clock being higher than that of the reference clock;
a comparing unit that compares the second count with the first count to generate three comparison results; and
a search module, coupled to the comparing unit, that selects three candidate frequency curves from a plurality of candidate frequency curves and selects a frequency curve from the three candidate frequency curves respectively corresponding to the three comparison results; and
a VCO, coupled to the search module, that calibrates an output frequency according to the frequency curve.

15. The PLL as claimed in claim 14, wherein the main frequency divider coupled to the VCO frequency divides the output frequency to generate the first feedback clock.

16. The PLL as claimed in claim 14, wherein the comparison result is one of the following: the second count greater than the first count, the second count is equal to the first count, and the second count is smaller than the first count.

17. The PLL as claimed in claim 14, the main frequency divider further generating a second feedback clock, the PLL further comprising:
a phase-frequency detector (PFD), coupled to the reference frequency divider and the main frequency divider, that receives the reference clock and the second feedback clock from the reference frequency divider and the main frequency divider, respectively, and detects a phase difference between the reference clock and the second feedback clock to selectively generate an up index or a down index when the PLL is in a phase locked mode;
a charge pump, coupled to the PFD, that adjusts a control current according to the up index or the down index; and
a loop filter, coupled to the charge pump and the VCO, that adjusts a control voltage outputted from the loop filter to the VCO according to the control current.

18. The PLL as claimed in claim 14, wherein the VCO calibrates the output frequency according to the frequency curve, and the search module coupled to the first counter and the second counter generates a control signal to the first counter and the second counter according to whether a ratio of the output frequency calibrated according to the frequency curve to the reference frequency approximates a predetermined ratio to operate the first counter and the second counter.

19. The PLL as claimed in claim 14, further comprising a shifting unit that shifts the first count by M bits to generate a shifted count with N bits, wherein the first count has (N−M) bits, the second count has N bits, N and M are positive integers, and N is greater than M.

20. The PLL as claimed in claim 14, wherein the VCO calibrates the output frequency according to the frequency curve, the frequency detecting module iterates a frequency calibration procedure of the PLL in a frequency locked mode until a ratio of the calibrated output frequency to the reference frequency approximates a predetermined ratio, and the monitoring period of a first iteration of the frequency calibration procedure has a length in time that is different from that of a second iteration of the frequency calibration procedure.

* * * * *